(12) United States Patent
Motika et al.

(10) Patent No.: US 7,010,735 B2
(45) Date of Patent: Mar. 7, 2006

(54) STUCK-AT FAULT SCAN CHAIN DIAGNOSTIC METHOD

(75) Inventors: Franco Motika, Hopewell Junction, NY (US); Philip J. Nigh, Williston, VT (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 10/043,486

(22) Filed: Jan. 10, 2002

(65) Prior Publication Data

US 2003/0131294 A1   Jul. 10, 2003

(51) Int. Cl.
    G01R 31/28    (2006.01)

(52) U.S. Cl. .................................... 714/726; 714/799
(58) Field of Classification Search ............... 714/724, 714/727, 726, 728, 729, 732, 733, 745, 25, 714/48
See application file for complete search history.

(56) References Cited

U.S. PATENT DOCUMENTS 5,303,246 A * 4/1994 Anderson et al. ........... 714/727

OTHER PUBLICATIONS

"A Technique for Fault Diagnosis of Defects in Scan Chains", Guo et al., Int'l Test Conference Proceedings 2001, Oct. 30-Nov. 1, 2001, pp 268-277.*
"Fast Technique for Locating Faults in Shift Register Latches", IBM Technical Bulletin NN7906229, Jun., 1979.*
"Combined Multi Corner Testing with Time and or Voltage Modulation", IBM Technical Bulletin NN81081677, Aug. 1981.*
"Measurement of Power Bus Noise Sensitivity of VLSI Circuits with Automated Functional Tester", IBM Technical Disclosure NN9201226.*

* cited by examiner

Primary Examiner—Albert Decady
Assistant Examiner—John P. Trimmings
(74) Attorney, Agent, or Firm—Lynn L. Augspurger; James E. Murray

(57) ABSTRACT

While data cannot be transmitted down a scan chain through a stuck-at fault location, data in properly operating latches downstream of the stuck-at fault location can be shifted down the chain. By varying operating parameters, such as power supply and reference voltages, clock timing patterns, temperature and timing sequences, one or more latches down the SRL chain from the stuck-at fault location may be triggered to change state from the stuck-at fault value. The SRL chain is then operated to shift data out the output of the SRL chain. The output is monitored and any change in value from the stuck-at state is noted as identifying all good latch positions to end of the chain. The process is repeated: varying each of the selected operating parameters until the latch position following the stuck-at fault latch is identified.

14 Claims, 5 Drawing Sheets

STUCK-AT FAULT SCAN CHAIN DIAGNOSTIC METHOD

FIELD OF THE INVENTION

The present invention relates to testing of complex combinatorial and sequential logic circuits embodied in large scale integration (LSI) and very large scale integration (VLSI) circuit devices and more particularly, to the diagnosing of broken or stuck-at fault scan chains.

BACKGROUND OF THE INVENTION

A fault occurring anywhere in such a LSI or VLSI circuit device can have its effect propagated through a number of feedback loops including storage or memory elements in the sequential logic before reaching a testable output of the device. Level sensitive scan design (LSSD) rules were devised to eliminate the complications in testing caused by this propagation through feedback loops. As described by E. B. Eichelberger and T. W. Williams in an article entitled "A Logic Design Structure for LSI Testablility" on pages 462–468 of the Proceedings of the 14th Design Automation conf., LSSD rules impose a clocked structure on logic circuit memory elements such as latches and registers and require these memory elements be tied together to form a shift register scan path so that they are accessible for use as test input and output points. Therefore, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD techniques include U.S. Pat. Nos. 3,783,254; 3,784,907; 3,961,252 and 4,513,418. The subject matter of these patents and the above described Eichelberger and Williams article are hereby included by reference.

As shown in FIG. 1, in accordance with LSSD rules, shift register latches (SRL's) 100 on a semiconductor chip 102 are joined together to form a shift register LSSD scan latch chain 104 to facilitate testing of combinational logic blocks 106, 108 and 110 interconnected by the SRLs 100 of the scan latch chain 104. Data is inputted to the combinational logic blocks 106, 108 and 110 and the SRLs 100 in a parallel respective primary inputs (PIs) 112 of the chip 102. Data is outputted from the combinational logic blocks 106, 108 and 110 and the SRLs 100 in parallel through the primary outputs (POs) vectors 114 of the chip 102. During testing, the scan chain latch circuits 100 may also be loaded serially. Serial input (SRI) 116 provides a serial input to the scan chain latch circuits 104. Similarly, serial output (SRO) 118 provides an output from scan chain latch circuits 104. Scanning inputs into the serial input SR 116 and out serial output 118 enables testing the SRLs 104 independently of the combinational logic 106, 108 and 110. It also allows each of the individual SRLs to be used as a pseudo-primary input or a pseudo-primary output for a combinational logic block 106, 108 or 110. The logic circuits in each of the logic blocks to be tested separately of circuits in other of the logic blocks.

A major drawback of LSSD test methodology is encountered when the LSSD scan chain circuit 104 is not functioning properly and access to the internal logic of the circuit is greatly reduced. This is often the case early in the technology or product introduction cycle when the yields are relatively low or even zero. In these situations, the rapid determination of the fault's root cause is critical, but not easily diagnosed. For example, when there is a stuck-at 0 or 1 fault on scan chain 104. For instance, with a stuck-at logic 0 fault, after a certain number of clock cycles, a serial output of logic 0's will come out of the scan chain 104 at the output 118 no matter what combination of 0's and 1's is scanned in the input 116. When this occurs, it can be determined that there is a stuck-at 0 fault in the scan chain 104, but the exact SRL 100 with the stuck-at fault condition is not isolated. While several techniques have been developed in the past to diagnose this type of failure, these techniques have produced limited success in identifying the stuck-at fault location. One series of suggestions involves modification of the structure of the latches and/or the scan chain configurations. The suggested new latch/scan chain configurations generally add hardware overhead or offer minimum or no improvement in fault coverage. In addition, scan diagnostic approaches have been proposed. Most of these test approaches are based on cause-effect algorithms. Such software solutions for diagnosing the broken scan chain generally need more storage and simulation time, and if the logic circuits between the SRLs have faults, diagnostic resolution is very poor.

BRIEF DESCRIPTION OF THE INVENTION

In accordance with the present invention, the physical environment of latches is perturbated to change the state of latches following a stuck-at defective point. While data cannot be transmitted down a scan chain through a stuck-at fault location, data in properly operating latches downstream of the stuck-at fault location can be shifted down the chain. By varying an operating parameters, such as power supply and reference voltages, clock timing patterns, temperature and timing sequences, one or more latches down the SRL chain from the stuck-at fault location may be triggered to change state from the stuck-at fault value. The SRL chain is then operated to shift data out the output of the SRL chain. The output is monitored after a parameter is varied and any change in value of a latch from the stuck-at state is noted as identifying all good latch positions from that latch to the end of the chain. The process is repeated varying each of the selected operating parameters to locate the latch position following the stuck-at fault latch.

Therefore, it is an object of the present invention to provide improved testing methods for use in LSSD testing.

A further object of the invention is to provide improved stuck-at fault scan chain diagnosis.

Another object of the invention is to locate stuck-at fault latches in an SRL chain.

BRIEF DESCRIPTION OF THE DRAWINGS

These and other objects of the invention are best understood by reading the following description of various embodiments of the invention while making reference to the accompanying figures of which.

DETAILED DESCRIPTION OF THE EMBODIMENTS

Figure 1:
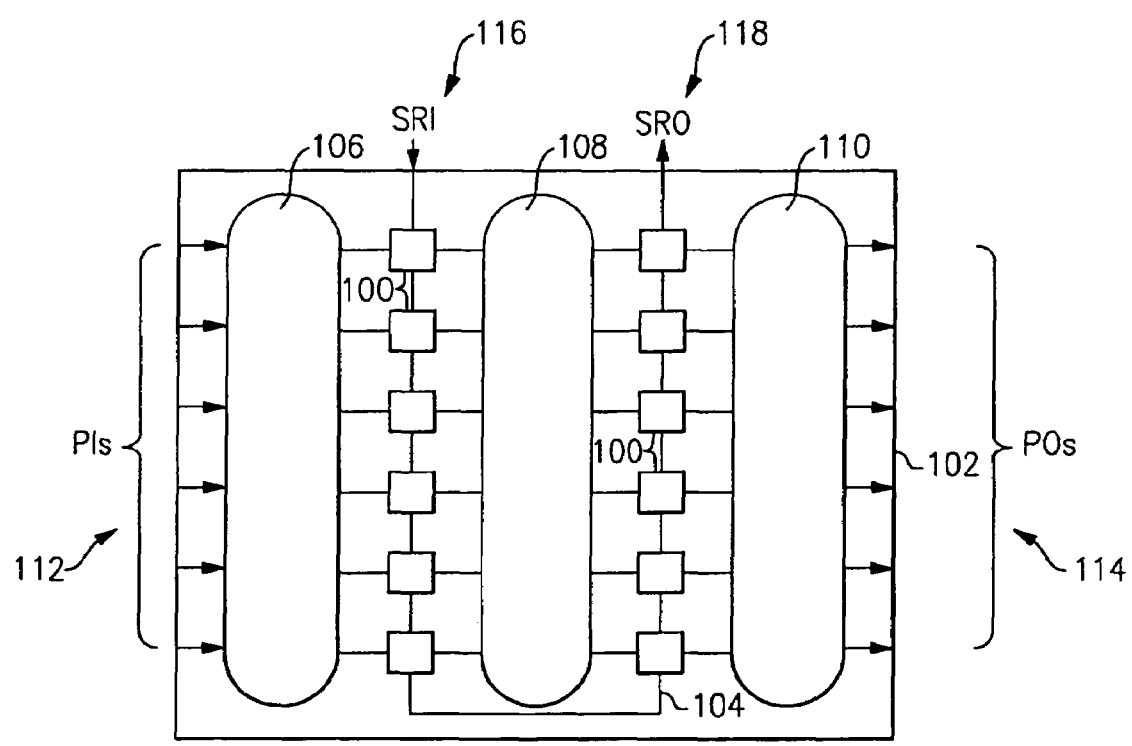
FIG. 1 is a schematic diagram of a VLSI semiconductor chip with SRLs arranged in an LSSD chain.

Reference will now be made to embodiments of the invention shown in the accompanying drawings. Where possible, the same reference numerals are used throughout the drawings to refer to the same or like parts.

Figure 2:
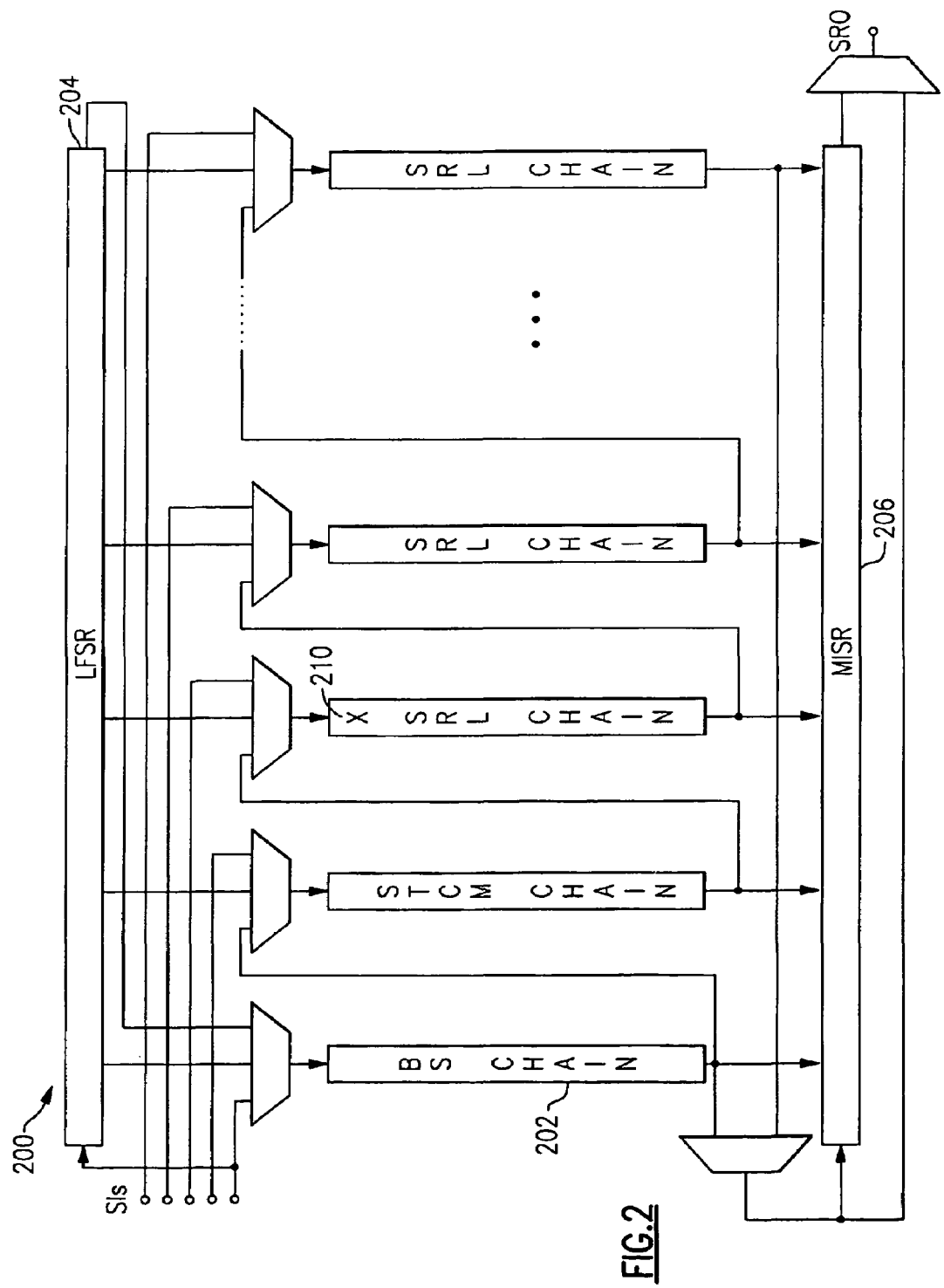
FIG. 2 is a schematic of an Logic Built-In Self Test (LBIST) arrangement with a stuck-at fault condition.

FIG. 2 shows a typical configuration for a LBIST circuit 200, shown in U.S. Pat. No. 5,983,380, the contents of which patent is hereby incorporated by reference. In that LBIST circuit, SRLs in the SRL chain 202 (with serial inputs (SIs) and serial output (SRO)) perform both input data launching and output data capturing. The test patterns come from a scan path that is configured into a linear feedback shift register (LFSR) 204. The test data are then outputted into the multiple input shift register (MISR) 206 for data compression. Alternate scan path shift cycles are applied to the SRLs exercising the combinational logic with the contents of the SRLs and capturing the results of the response of the combinational logic back into the SRLs where they are used as the test inputs for the next cycle. At the end of the requisite number of cycles, the contents of the scan path is read out as the signature to be compared with the desired value. As pointed out previously, a major drawback of LSSD test methodology is encountered when a LSSD scan chain circuit is not functioning properly and access to the internal logic of the circuit is greatly reduced. This is often the case early in a product's introduction cycle when the yields are relatively low or even zero. In these situations, the rapid determination of the fault's root cause is critical but not easily diagnosed. A primary cause of LSSD scan chain malfunctioning is when there is a stuck-at 0 or 1 fault stage 210 in a SRL scan chain 202.

Figure 3:
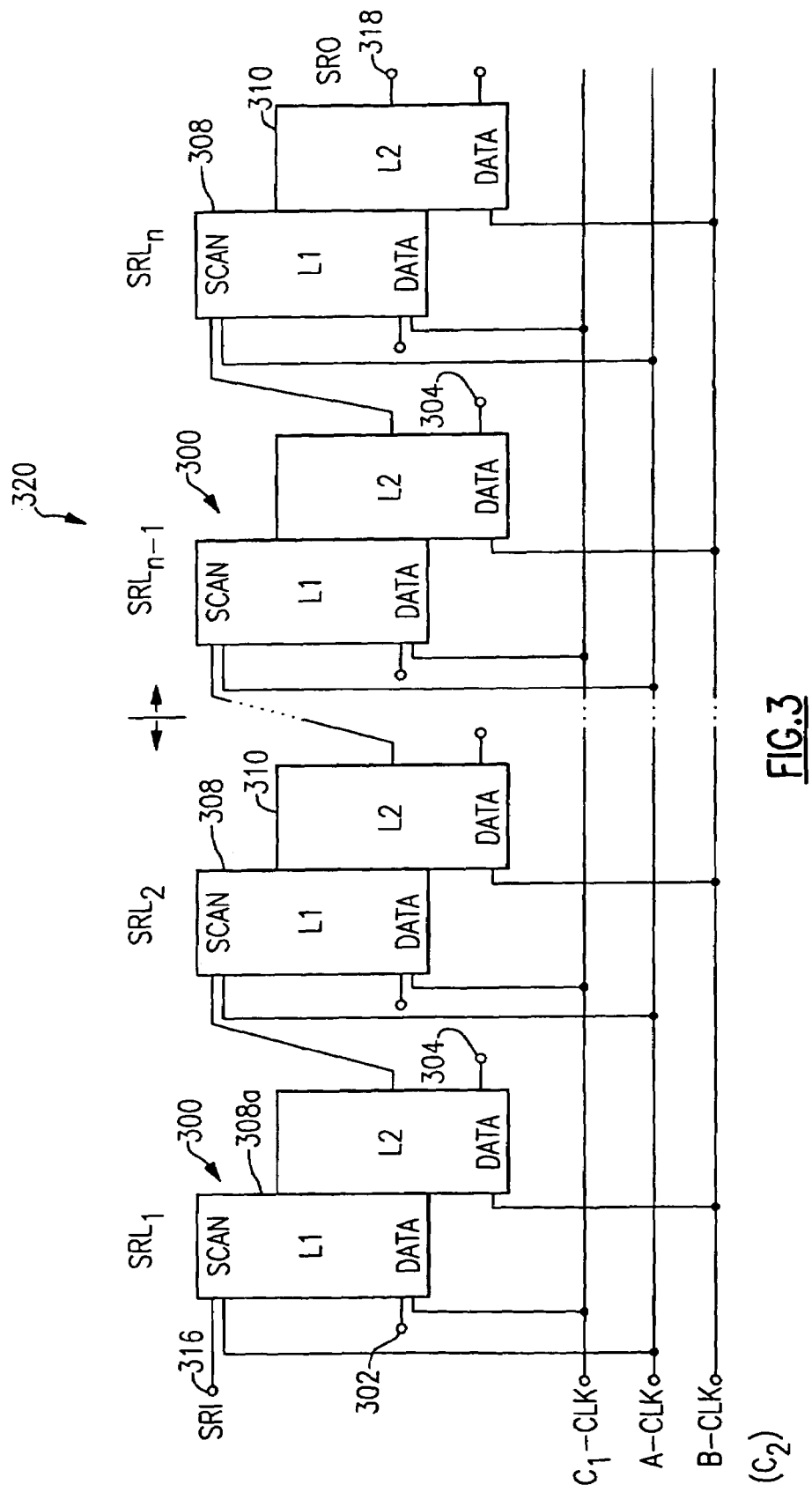
FIG. 3 is a schematic of the shift register logic (SRL) chain of the LBIST arrangement of FIG. 2.

SRL scan chain 320 in FIG. 3 is a type of the scan chain circuits found in FIGS. 1 and 2. It comprises a plurality of shift register latches (SRLs) 300 (herein designated as $SRL_1$, $SRL_2$, ..., $SRL_{N-1}$, $SRL_N$) in which each SRL 300 includes a master latch 308 and a slave latch 310. For transfer of data between the latches and combinational logic, 106, 108 and 110 such as that shown in FIG. 1, each of the SRLs 300 contains a data input terminal 302 from combinatorial logic circuits and a data output terminal 304 to combinatorial logic circuits. In addition, data can be introduced into the latches at shift register input (SRI) terminal 316 and transferred from one SRL to another to the shift register output (SRO) terminal 318. As described below, data is clocked into each SRL 300 by applying a clock pulse to master latch 308, and data is clocked out of each SRL 300 by applying a clock pulse to slave latch 310. Data is outputted from slave latch 310 to a succeeding master latch 308. For this purpose, the operation of the LSSD scan chain 320 is controlled by scan clock signals on the a-clk, b-clk and c-clk lines. Serial loading of the master latch 308a from the SRI 316 occurs upon generation of an a-clk pulse on a-clk line. The a-clk pulse on a-clk line causes serial input applied to the SRLs 300 to be inputted to each master latch 308. Application of a b-clk on b-clk line causes data to be output from the SRLs via slave latches 310. The continuous, alternating application of a-clk and b-clk clock pulse signals on the a-clk and b-clk lines respectively, sequentially propagates a data signal applied to SRI terminal 316 through scan chain 320 to SRO terminal 318. To effect a parallel load, a $c_1$-clk block pulse is applied to $c_1$-clk line. This causes a parallel load of data via parallel data inputs 302 and combinational logic to each master latch 308 of the SRLs 300. Application of a b-clk or $c_2$-clk pulse to the b-clk line causes a parallel output of data from each slave latch 310 of SRLs 300 to provide data on respective parallel output data lines 304.

Figure 4:
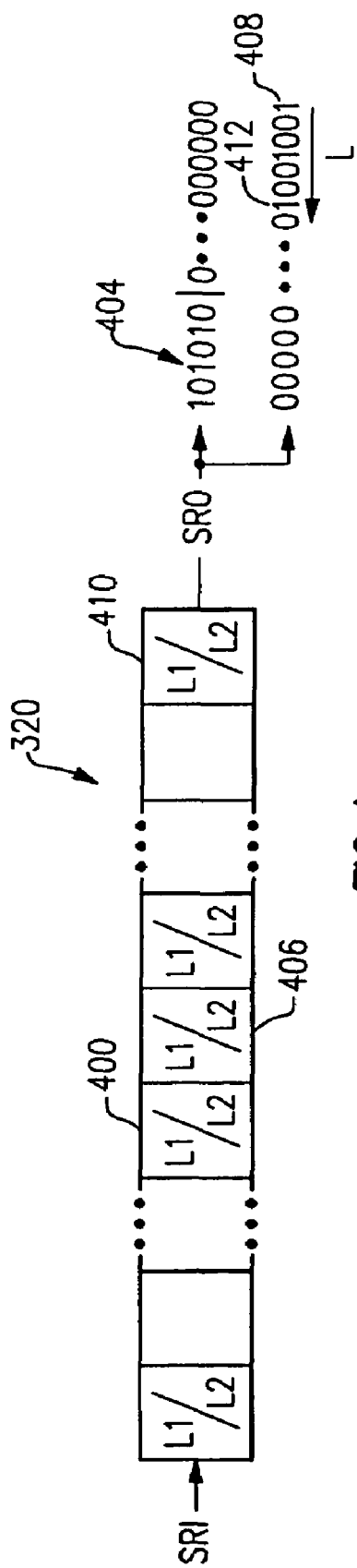
FIG. 4 is a schematic diagram illustrating the SRL scan chain stuck-at fault problem and applicants' solution to the problem.

As shown in FIG. 4, with one of the SRLs 400 in the scan chain 320 stuck-at fault, the output 404 at the SRO of the LSSD scan chain 320 will change to a string of all "0s" or "1s". As shown, the change in data in the string is all "0s" after data (101010) from the latches 406 to 410 succeeding the bad latch 400 are shifted out the stuck-at fault state of the failing latch 400. Since the stuck-at fault latch 400 is intermediate, the input SRI and the output SRO of the chain 320, it is impossible to pass data down the LSSD chain 320 to determine the exact position on the failing bit 400 in the LSSD chain 320. In accordance with the present invention, disturb sequences are applied to the LSSD chain to cause one or more latches in the chain after the stuck-at fault latch 400 to change state from that transmitted to it by the stuck-at fault latch 400, and then the LSSD chain is run to pass the states of the various latches to its output SRO. By counting back from the output signal 408 produced by the last bit 410 in the chain 320 to the output signal 412 furthermost from the output signal 408 to have changed state, the location of the latch 406 producing the change can be determined. The assumption is that after running all disturb sequences of the test the changed data bit 412 is from the latch 406 adjacent to the failing latch 400 and that all the latches 406 to 410 are good.

Figure 5:
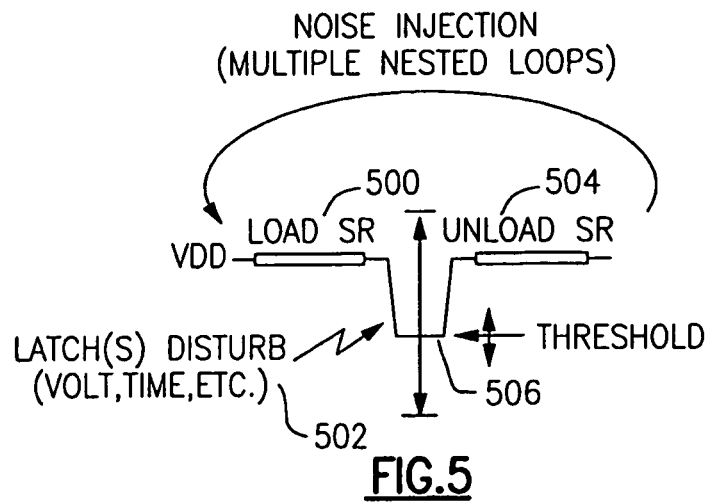
FIG. 5 is a schematic diagram illustrating the loading of the stuck-at fault chain in accordance with the present invention.
Figure 6:
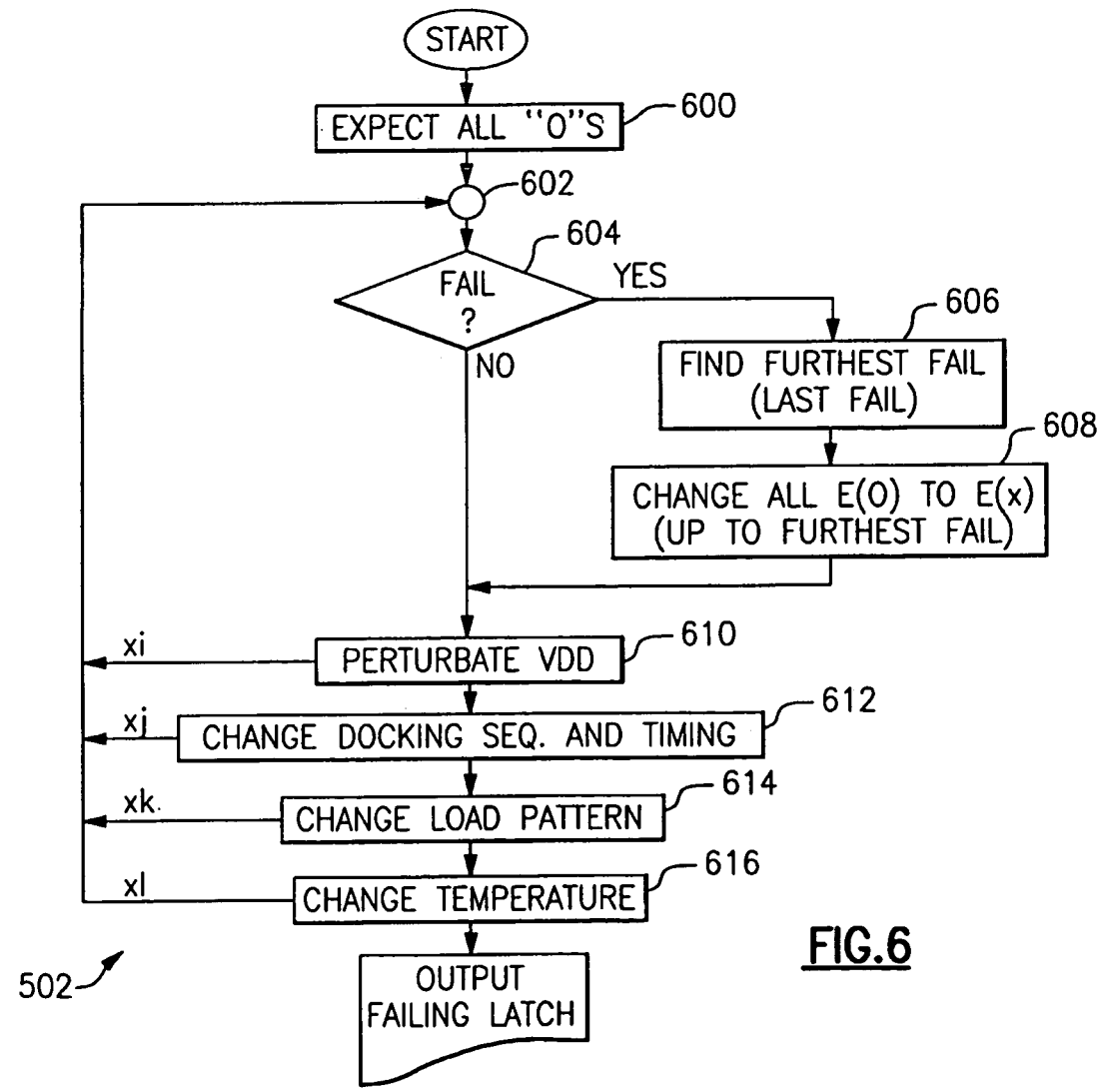
FIG. 6 is a flow diagram of a method of diagnosing of a scan chain of FIG. 4 with a stuck fault condition utilizing the proposed concept.

The test technique and diagnostic algorithm are depicted in FIGS. 5 and 6. As shown in FIG. 5, first the desired stuck-at fault pattern is loaded in the scan chain 500. Then the latch disturb stimulus is applied 502. Each different latch disturb application is followed by the scan chain unload 504.

As shown at 600 in FIG. 6, the expected value for all the latches in the scan chain is set to the output's stuck-at level (i.e. Exp"0" for the stuck-at-0 chain or Exp"1" for the stuck-at-1 chain). This expect value is compared at 602 with the actual output from the scan chain for failure of any bit position to be in its expected value.

If either initially or after any disturb step 500 such a failure is detected at 604, the latch furthest from the scan chain output to fail is determined 606 and all expects for latches following and including that farthest failing latch are masked out (Exp"x") 608 so that they are no longer considered.

Repeat steps 502 and 504 as discussed above for each of the disturb conditions 610 to 616.

Each of the disturb conditions 610 to 616 is repeated a specific number of times as shown by the corresponding loop index (i,j,k,l). Each latch disturb process 502 is centered around the switching threshold 506 of the latches and can randomly or systematically vary in the vicinity of that threshold. The working threshold can be determined empirically using a similar functional scan chain or by circuit analysis and simulation.

The variables typically perturbed include the device power supply (Vdd) and Vref., clock timing edges, pattern and timing sequences, and temperature. Of these, changing temperature is the slowest process and is usually performed in multiple test passes. Other parameters can be also used to induce switching noise, but the basic diagnostic algorithm remains the same.

In the case where there are multiple faults in the same scan chain, the diagnostic process is similar, but the localization of the problem can be usually narrowed down to a range of latches rather than a single latch. Although the disclosed technique does not work 100% on all defective devices, it has been found to be highly effective and yielded good diagnosis in many instances of stuck-at scan chain problems.

The proposed solution is superior to other methods because it provides a efficient and unique solution to the stuck-at scan chain diagnostics with the following benefits:
1. Rapid on-the-fly diagnosis.
2. Pinpoints defective SRL with high probability.
3. Compatible with existing test methodologies and test systems.
4. Eliminates extensive test result data collection.
5. Implementation is relatively simple.
6. Easily simplified and automated for manufacturing test.
7. Quick and direct path from test systems to PFA.

Furthermore, these new approaches are highly effective when diagnosing unmodeled faults, AC defects, and intermittent fails that do not conform to the classical or conventional stuck-at or transitional fault models. Also, many of the underlying basic concepts can be generalized and integrated into general purpose automated test generation and diagnostic products.

Although we have been discussing the use of this concept with respect to particular scan designs and test methodologies, the real benefits can be realized on LBIST designs that support on on-product clock generation and integrated latch disturb designs supported by built-in diagnostic algorithms.

Figure 7:
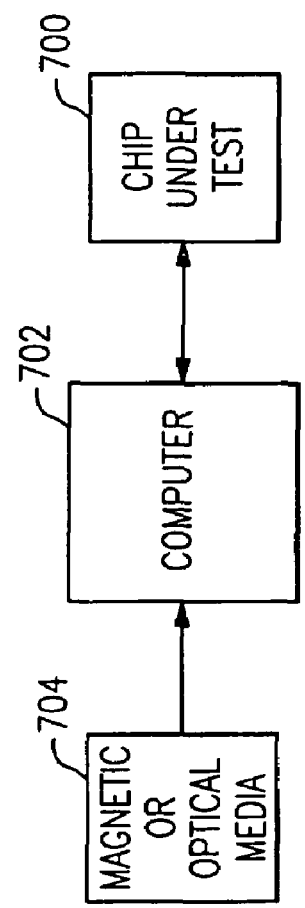
FIG. 7 is a block diagram of a computer system for use with the present invention.

As shown in FIG. 7, the testing algorithm to test a chip 700 can be provided to the testing computer 702 on magnetic or optical media 704.

The foregoing discussion discloses and describes exemplary embodiments of the present invention. One skilled in the art will readily recognize from such discussion, and from the accompanying drawings and claims, that various changes, modifications and variations can be made therein. For instance, the invention has been described in terms of particular scan chain and shift register configurations. Of course, it is applicable to other such configurations. Furthermore, other means may be provided to change the state such as use of electric and magnetic fields and light emission and may be varied throughout the operating range and beyond to determine defect sensitivities and to improve or aggravate device response. Therefore, it should be understood that the present invention is not limited to those embodiments but all embodiments within the spirit and scope of the invention as defined in the following claims.

The invention claimed is:

1. A computer program on a media usable with a computer for testing combinational and sequential logic circuits where memory units are coupled together to form shift register latches that are arranged in a shift register scan path with an input and output for testing the logic circuits, said computer program comprising:

load pattern computer code for shifting data through the scan path to load the shift register latches with a first data pattern representative of a stuck-at fault condition and thus introducing said data into an inaccessible latch in a stuck-at fault LSSD chain;

pattern variation computer code for causing permutation of at least one of the following operating parameters: a supply voltage, a reference voltage, a timing pattern temperature and a timing sequence to trigger a change in state of at least one of the memory units in the shift register scan path for the purpose of locating stuck-at fault bits in said LSSD chain; and analyzing computer code for determining the memory unit farthest from the shift register scan path output that has changed state from its loaded value for the purpose of locating stuck-at fault bits in said at least one of the memory units.

2. The computer program of claim 1, wherein said pattern variation computer code is for causing permutations in a plurality of the operating parameters.

3. The computer program of claim 2, wherein said analyzing computer code includes shifting code for shifting data out of the scan path after each of the operating parameters is separately permuted.

4. The computer program of claim 3, wherein said analyzing computer code includes selection computer code for selecting the last bit read out that has changed from its load pattern as being from the shift register latch closest to the stuck-at fault condition.

5. A method for testing combinational and sequential logic circuits where memory units are coupled together to form shift register latches, arranged in a shift register scan path with an input and output for testing the logic circuits, the method comprising:

determining a stuck-at fault condition exists in one of the shift register latches;

shifting data through the scan path to load the shift register latches with a first data pattern representative of the outputs state as a result of the stuck-at fault condition and thus introducing said data into an inaccessible latch in a stuck-at fault LSSD chain;

causing permutation of at least one of the following operating parameters: a supply voltage; a reference voltage; a timing pattern temperature and a timing sequence to trigger a change in state from the stuck-at fault state of at least one of the memory units in the shift register scan path for the purpose of locating stuck-at fault bits in said stuck-at fault LSSD chain; and determining the memory unit furthest from the shift register scan path output that has changed state from its loaded value for the purpose of locating stuck-at fault bits in said at least one of the memory units.

6. The method of claim 5 including:

causing permutations in a plurality of the operating parameters in determining said memory unit furthest from the shift register scan path output.

7. The method of claim 6 including:

shifting data out of the scan path after each of the operating parameters is separately permuted.

8. The method of claim 7 including:

selecting the last bit read out that has changed from its load pattern as being from the shift register latch closest to the stuck-at fault state condition.

9. The method of claim 5 including loading all shift register latches of the scan chain with stuck fault output state.

10. A computer program on a media usable with a computer for testing combinational and sequential logic circuits where memory units are coupled together to form shift register latches that are arranged in a shift register scan path with an input and output for testing the logic circuits, said computer program comprising:

stuck fault detection code for detecting a stuck-at fault output level of the shift register scan path from an expect state;

a load pattern computer code for shifting data through the scan path to load the shift register latches of the scan path with the detected stuck-at fault output level condition and thus introducing said data into an inaccessible latch in a stuck-at fault LSSD chain;

pattern variation computer code for causing permutation of at least one of the following operating parameters: a supply voltage, a reference voltage, a timing pattern temperature and a timing sequence to trigger a change in state of at least one of the memory units in the shift register scan path that is detectable at the output of the shift register scan path for the purpose of locating stuck-at fault bits in said stuck-at fault LSSD chain; and analyzing computer code for determining the memory unit furthest from the shift register scan path output that has changed state from its loaded value as a result of permutations of an operating parameter for the purpose of locating stuck-at fault bits in said at least one of the memory units.

11. The computer program of claim 10 including masking code for masking out all expects for latches following and including a farthest failing latch.

12. The computer program of claim 11, wherein said pattern variation computer code is for causing permutations in a plurality of the operating parameters centered around a working threshold varying the operating parameters in the vicinity of the working threshold.

13. The computer program of claim 12, wherein said analyzing computer code includes shifting code for shifting data out of the scan path after each of the operating parameters is separately permuted.

14. The computer program of claim 11, wherein said analyzing computer code includes selection computer code for selecting the last bit read out that has changed from its load pattern as being from the shift register latch closest to the memory unit having the stuck-at fault.

* * * * *